US005935757A

United States Patent [19]

Yamada et al.

[11] Patent Number: 5,935,757

[45] Date of Patent: Aug. 10, 1999

[54] HEAT-SENSITIVE RECORDING MATERIAL

[75] Inventors: Hisao Yamada; Yoshihiro Jinbo; Naoto Yanagihara, all of Shizuoka-ken, Japan

[73] Assignee: Fuji Photo Film Co., Ltd., Kanagawa, Japan

[21] Appl. No.: 08/975,484

[22] Filed: Nov. 20, 1997

[30] Foreign Application Priority Data

Nov. 22, 1996 [JP] Japan .................................... 8-312003

[51] Int. Cl.$^{6}$ .............................. G03C 1/54; G03F 7/016

[52] U.S. Cl. .......................... 430/138; 430/156; 430/157; 430/160; 430/162; 430/171; 430/179; 503/215; 503/227

[58] Field of Search ..................................... 430/138, 156, 430/171, 179, 157; 503/215, 227

[56] References Cited

U.S. PATENT DOCUMENTS

| | | | |
|---|---|---|---|
| 4,334,004 | 6/1982 | Scheler | 430/180 |
| 4,644,376 | 2/1987 | Usami et al. | 430/179 |
| 4,891,297 | 1/1990 | Takashima et al. | 430/138 |
| 5,486,446 | 1/1996 | Matushita et al. | 430/156 |

FOREIGN PATENT DOCUMENTS

| | | | |
|---|---|---|---|
| 62-99189 | 5/1987 | Japan | B41M 5/18 |
| 9-39389 | 2/1997 | Japan | B41M 5/26 |
| 2182157 | 5/1987 | United Kingdom . | |

*Primary Examiner*—John S. Chu
*Attorney, Agent, or Firm*—Sughrue, Mion, Zinn, Macpeak & Seas, PLLC

[57] ABSTRACT

A heat-sensitive recording material having a support and a heat-sensitive recording layer provided thereon. The heat-sensitive recording layer contains a diazonium salt compound and a coupler which reacts with the diazonium salt compound upon heating to form a color. The heat-sensitive recording layer contains a compound of the following formula (I):

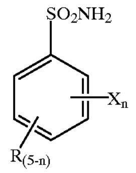

wherein R represents a member selected from the group consisting of a hydrogen atom, a halogen atom, an alkyl group, and an aryl group; X represents a member selected from the group consisting of —$COOR^1$, —$OCOR^{-1}$, —$CONR^1R^2$, and —$NR^2COR^1$; $R^1$ represents an alkyl group or an aryl group, $R^2$ represents a member selected from the group consisting of a hydrogen atom, an alkyl group, and an aryl group; n represents an integer from 1 to 5.

19 Claims, No Drawings

HEAT-SENSITIVE RECORDING MATERIAL

BACKGROUND OF THE INVENTION

1. Field of the Invention

The present invention relates to a heat-sensitive recording material making use of the photosensitivity of a diazonium salt. More particularly, the present invention relates to a heat-sensitive recording material containing a diazonium salt with an improved color forming property and storability before use.

2. Description of the Related Art

Recording materials making use of the photosensitivity of diazo compounds are broadly categorized into three types. Materials classified into a first group are subjected to wet development (known as wet-development-type materials), in which a photosensitive layer containing as a primary component, a diazo compound and a coupling component is provided on a support, and the resultant recording material, after being placed on an original, is exposed to light and subsequently developed in an alkaline solution. A second group is known as dry-development-type materials.

Materials classified into this group are different from those of the first group. They are developed with ammonia gas. A third group is known as heat-development-type materials, and includes a type in which an ammonia gas generating agent such as urea, which can generate ammonia gas under the application of heat is contained in a photosensitive layer; a type in which an alkali salt of an acid such as trichloroacetic acid which loses its an acid nature under the application of heat is contained in a photosensitive layer; and a type in which a diazo compound and a coupling component are activated during thermal fusion by use of a higher fatty acid amide serving as a color development aid.

The wet-development-type material has several drawbacks in maintenance such that development solution is required to be replenished or discarded, resulting in being cumbersome in processing the material and in a large apparatus. Further, handwriting cannot be added to a fresh copy immediately after copying because the copy is wet and a copied image cannot endure long-term storage. The dry-development-type material is also problematic in that development solution must be replenished, and a gas absorption apparatus is required in order to prevent leakage of the generated ammonia gas, leading to an increase in size of the apparatus similar to the wet-development-type material. In addition, the dry development-type material has another problem in ammonia odor immediately after copying. In contrast to the wet- or dry-development-type materials, the heat-development-type material does not require development solution and therefore has an advantage in maintenance. However, conventionally known heat-development-type materials have drawbacks such that a high temperature of 150–200° C. is required for development and the temperature has to be controlled within ±10° C. so as to avoid insufficient development or change of a color line, resulting in a high cost of the apparatus. Moreover, the high temperature development means that the diazo compounds used must have heat resistance. In many cases, however, heat-resistant diazo compounds do not form satisfactory high-density images. Although many attempts have been made at low temperature development (90–130° C.), reduction in shelf life of the material itself is often seen. Thus, although advantages of heat-development-type recording systems in terms of maintenance when compared to dry-and wet-development-type materials have been well anticipated they have still not attained mainstream in diazo-recording system.

In order to obtain a desired color density by heating a recording material having a support and layers containing diazo compounds and coupling components provided thereon, during the heating process the components must be instantaneously fused, diffused, and reacted to form developed color dyes. During the reaction, the reaction system is preferably made basic so as to accelerate the reaction. Accordingly, in order to produce a photo- and heat-sensitive recording material that can be developed at low temperature and at a recording speed that does not hamper practical use, a basic substance must be incorporated in a coating layer.

Also, there have recently been proposed a photofixing-type heat-sensitive recording material which needs photofixation of an image and which forms an image by utilizing its property of being degraded and deactivated by the action light. Typical materials of this type form images by allowing bdiazo compounds to react with coupling components by the application of heat to thereby form an image, and subsequently, light is irradiated to fix the formed image (Koji Sato, et al., Journal of the Image Electronics Society, vol. 11, No. 4 (1982), pp. 290–296).

In the case of a diazo-type heat-sensitive recording material, coloring of the background portion of the material or during storage before copying or reduction in color density must be suppressed as much as possible.

Thus, a number of attempts have been made to prepare a diazo-type heat-sensitive material that assure a good shelf life and a high recording speed. However, so far no satisfactory materials suitable for practical use have been obtained.

In both heat-development-type diazo copy in material and thermally developable photofixing type heat-sensitive recording materials that develop color upon heating, there is a possibility of causing a color developing reaction during storage at room temperature prior to copying, if the materials are designed so as to be fully developed in color and to form an image having a high density even with low temperature heating. This results in a coloration phenomenon occurring in the background area of the material that must be white. Particularly, when a red-color forming type recording material is used, there is a problem in that a slight coloring (fogging) of the material is quite conspicuous, since the lunsinosity factor is high in this color. In order to solve this problem of apparently compatible with each other, the present inventors conducted extensive studies of recording materials having a support and a heat-developable photosensitive layer, containing a diazo compound, a coupling component, and a basic substance, in which the diazo compound is allowed to contain in a microcapsule. Further, the inventors continued to search for suitable basic substances, and how to make microcapsules, and eventually succeeded in preventing coloring of the background area the material surface during storage of the material prior to use for copying (Japanese Patent Application Laid-Open (JP-A) No. 2-54251). The present inventors also studied color developing aids that accelerate color developing reaction, and found that p-toluenesulfonamide and certain other substances exhibit excellent properties. In transparent overhead projector sheets and recording materials of multicolor recording materials and the like, it is preferable to use components not contained in microcapsules in emulsion form so as to reduce the haze of the recording layer. However, when the aforementioned arylsulfonamide compound is used in the emulsion form, these are problems such that loss of image quality arises due to precipitation of the compound during storage, or color is formed during storage through partial reaction of the compound due to its high water solubility. In order to overcome these problems, the present inventors further continued their research, and found that arylsulfonamides having specific substituents display excellent properties, leading to the present invention.

An object of the present invention is to provide a heat-sensitive recording material having high color developing sensitivity and excellent storability.

SUMMARY OF THE INVENTION

The above-mentioned object has been achieved by the heat-sensitive recording material comprising a support and a heat-sensitive recording layer provided thereon and containing a diazonium salt compound and a coupler which reacts with the diazonium salt compound upon heating to produce a color, wherein the heat-sensitive recording layer contains at least one compound of the following formula (I):

(I)

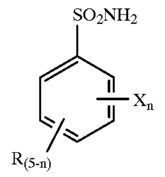

wherein R represents a member selected from the group consisting of a hydrogen atom, a halogen atom, an alkyl group, and an aryl group; X represents a member selected from the group consisting of —$COOR^1$, —$OCOR^1$, —$CONR^1R^2$, and —$NR^2COR^1$; $R^1$ represents an alkyl group or an aryl group, $R^2$ represents a member selected from the group consisting of a hydrogen atom, an alkyl group, and an aryl group; n represents an integer from 1 to 5; wherein when n is equal to or more than 2, X may be identical to or different from one another, and when n is equal to or less than 3, a R may be identical to or different from one another.

The above-mentioned object has also been achieved by a full-color heat-sensitive recording material comprising a support and a plurality of heat-sensitive recording layers provided one upon another thereon, the layers respectively different developed color hues, wherein at least one of the heat-sensitive recording layers is a layer containing a diazonium salt compound and a coupler which reacts with the diazonium salt compound upon heating to produce a color, which layer contains at least compound represented by the above-described formula (I).

The above-mentioned object has also been achieved by a full-color heat-sensitive recording material comprising a support and a first heat-sensitive recording layer containing an electron-donating colorless dye and an electron-accepting compound, a second heat-sensitive recording layer containing a diazonium salt compound having a maximum absorption wavelength of 360±20 nm and a coupler which reacts with the diazonium salt compound to produce a color, and a third heat-sensitive recording layer containing a diazonium salt compound having a maximum absorption wavelength of 400±20 nm and a coupler which reacts with the diazonium salt compound to produce a color, the layers being layered successively on the support, wherein the second heat-sensitive recording layer or the third heat-sensitive recording layer contains a compound represented by the above-described formula (I).

DETAILED DESCRIPTION OF THE INVENTION

The heat-sensitive recording material of the present invention comprises a support and a heat-sensitive recording layer provided thereon, the recording layer containing a diazonium salt compound and a coupler which reacts with the diazonium salt compound upon heating to produce a color, wherein the heat-sensitive recording layer contains at least one compound of the aforementioned formula (I).

In formula (I), R represents a member selected from the group consisting of a hydrogen atom, a halogen atom, an alkyl group, and an aryl group; X represents a member selected from the group consisting of —$COOR^1$, —$OCOR^1$, —$CONR^1R^2$, and —$NR^2COR^1$; $R^1$ represents an alkyl group or an aryl group, $R^2$ represents a member selected from the group consisting of a hydrogen atom, an alkyl group, and an aryl group; n represents an integer from 1 to 5; wherein when n is equal to or more than 2, X may be identical to or different from one another, and when n is equal to or less than 3, R may be identical to or different from one another.

Examples of halogen atoms represented by R include a fluorine atom, a chlorine atom, a bromine atom, and an iodine atom, with a chlorine atom being preferred.

Preferred examples of alkyl groups which may be used for R include alkyl groups of from 1 to 20 carbon atoms, and mention may be given of methyl, ethyl, propyl, butyl, tert-butyl, cyclohexyl, 2-pentyl, octyl, 2-octyl, 2-ethylhexyl, decyl, dodecyl, benzyl, 4-methoxybenzyl, and α-methoxybenzyl.

Most preferably, R is a hydrogen atom.

X is preferably —$COOR^1$ and —$NR^2COR^1$, with —$COOR^1$ being particularly preferred.

Most preferably, X is substituted at the meta-position of the sulfamoyl group.

The alkyl groups represented by $R^1$ or $R^2$ are preferably alkyl groups of from 1 to 20 carbon atoms, more preferably alkyl groups of from 6 to 12 carbon atoms. For example, methyl, ethyl, propyl, butyl, amyl, isoamyl, hexyl, cyclohexyl, pentyl, 2-pentyl, octyl, 2-octyl, 2-ethylhexyl, decyl, dodecyl, benzyl, 4-methoxybenzyl, 2-butoxypropyl, 3-methoxybutyl, and 2-phenoxyethyl may be used.

The aryl groups represented by $R^1$ or $R^2$ are preferably aryl groups having 6 to 20 carbon atoms, which include phenyl, tolyl, and 4-methoxyphenyl.

n is particularly preferably 1 or 2.

Specific examples of the compounds represented by formula (I) will now be given. These do not limit the present invention.

I-1

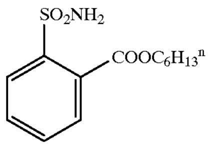

I-2

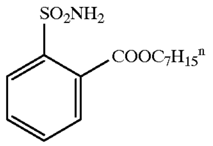

-continued
I-3
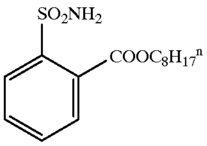
I-4
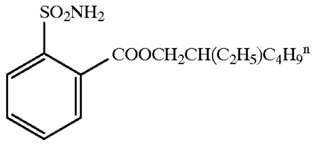
I-5
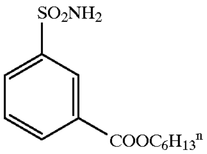
I-6
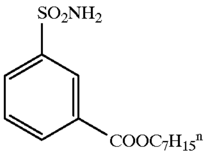
I-7
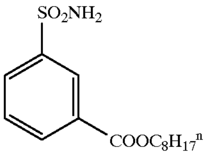
I-8
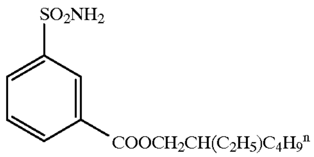
I-9
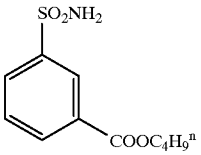
I-10
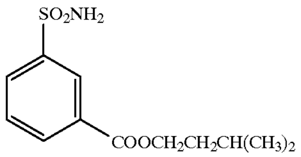
I-11
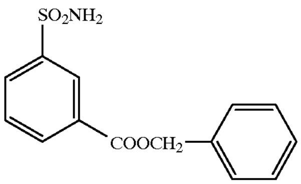
-continued
I-12
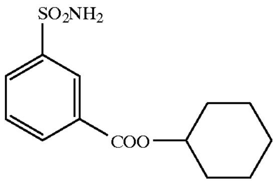
I-13
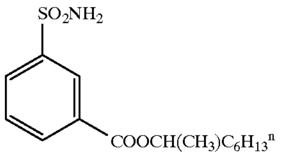
I-14
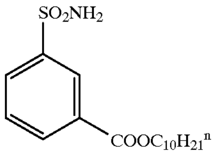
I-15
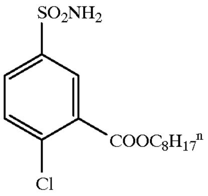
I-16
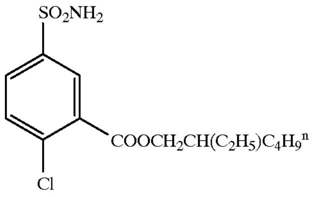
I-17
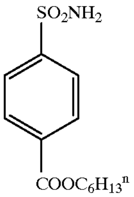
I-18
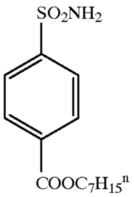
I-19
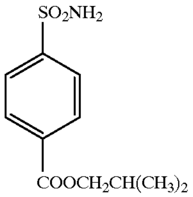

-continued
I-20
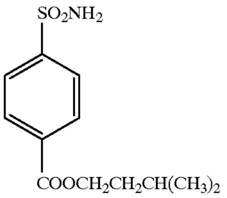
I-21
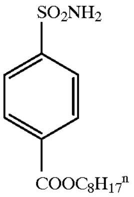
I-22
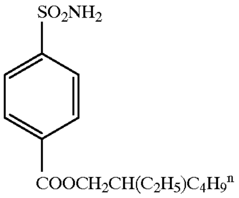
I-23
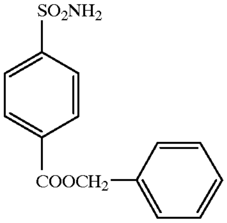
I-24
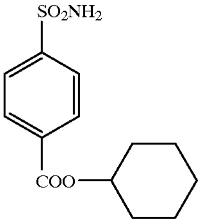
I-25
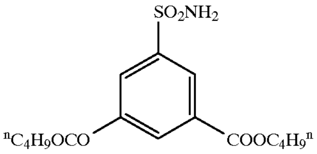
I-26
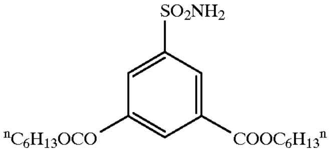
-continued
I-27
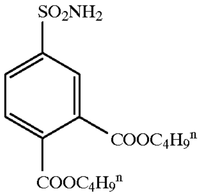
I-28
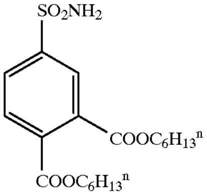
I-29
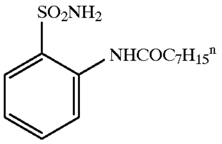
I-30
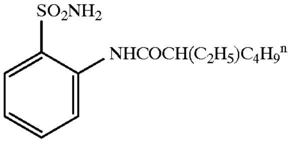
I-31
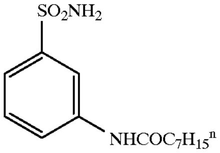
I-32
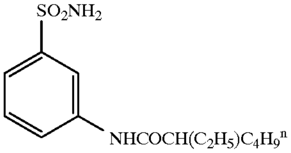
I-33
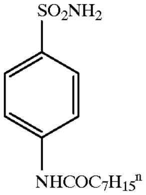
I-34
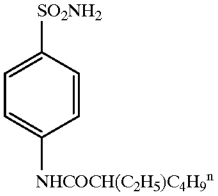

-continued

I-35

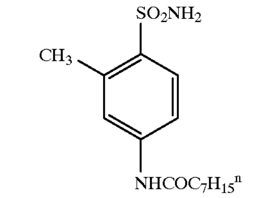

I-36

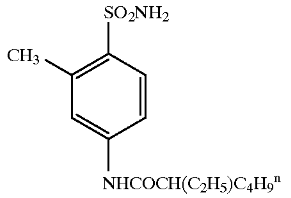

I-37

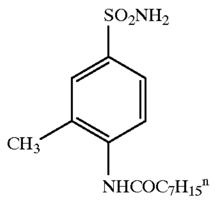

I-38

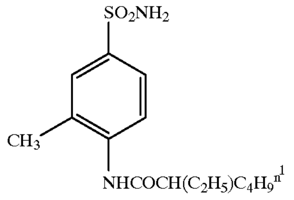

I-39

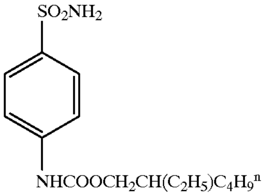

I-40

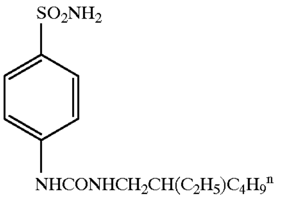

I-41

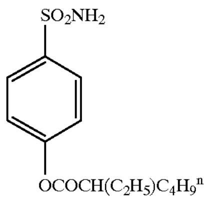

-continued

I-42

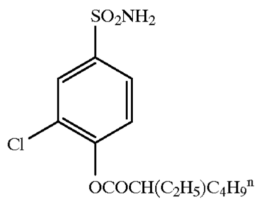

I-43

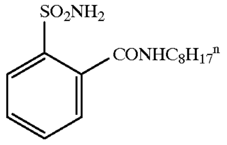

I-44

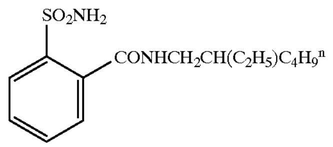

The compounds represented by formula (I) of the present invention may be used singly or in combinations of two or more species. The compound represented by formula (I) is preferably used in an amount of 0.02–6 $g/m^2$ in the heat-sensitive recording layer. From the viewpoint of color developing sensitivity, it is more preferably incorporated in an amount of 0.1–4 $g/m^2$.

In the present invention, the compound represented by formula (I) is preferably emulsified. The method of emulsification is not particularly specified, and known methods may be used. Specifically, a compound represented by formula (I) is dissolved in an organic solvent which is slightly soluble or wholly insoluble in water, and the resultant solution is mixed by stirring with an aqueous phase containing a surfactant and/or a water-soluble polymer as a protective colloid, to thereby form an emulsion. Details of the process for obtaining emulsions are described in JP-A No. 2-141279.

The diazonium salt compound which is used in the present invention is represented by the following formula (II), $$ArN_2^+B^- \qquad (II)$$

wherein Ar represents an aromatic moiety, $N_2^+$ represents a diazonium group, and $B^-$ represents an acid anion. The diazonium compound represented by formula (II) can form a color by a coupling reaction with a coupling component and can also be degraded by light.

Preferred aromatic moieties are those represented by the following formula:

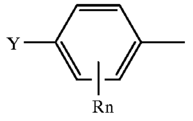

wherein Y represents a hydrogen atom, a substituted amino group, an alkoxy group, an aryloxy group, an arylthio group, an alkylthio group, or an acylamino group; and R represents a hydrogen atom, an alkyl group, an alkoxy group, an aryloxy group, an arylamino group, or a halogen atom (I, Br, Cl, F).

Preferred substituted amino groups represented by Y include a monoalkylamino group, a dialkylamino group, an arylamino group, a morpholino group, a piperidino group, and a pyrrolidino group.

Specific examples of diazoniums for forming salts include 4-diazo-1-tolylthio-2,5-dibutoxybenzene, 4-diazo-1-chlorophenylthio-2,5-dibutoxybenzene, 4-diazo-1-dimethylaminobenzene, 4-diazo-1-diethylaminobenzene, 4-diazo-1-dipropylaminobenzene, 4-diazo-1-methylbenzylaminobenzene, 4-diazo-1-dibenzylaminobenzene, 4-diazo-1-ethylhydroxyethylaminobenzene, 4-diazo-1-diethylamino-3-methoxybenzene, 4-diazo-1-dimethylamino-2-methylbenzene, 4-diazo-1-benzoylamino-2,5-diethoxybenzene, 4-diazo-1-morpholino-2,5-dibutoxybenzene, 4-diazo-1-anilinobenzene, 4-diazo-1-toluylmercapto-2,5-ethoxybenzene, 4-diazo-1,4-methoxybenzoylamino-2,5-diethoxybenzene, 4-diazo-1-pyrrolidino-2-ethylbenzene, 4-N-[methyl-2-(4-methoxyphenoxy)]ethyl, 4-diazo-N-(n-hexyl), N-[1-methyl-2-(4-methoxyphenoxy)]ethylamino-3-(n-hexyl) oxybenzene, and 4-diazo-3-[(1-ethylpropyl)oxy]-1-[bis(di (n-butyl)aminocarbonylmethyl]amino]benzene.

Specific examples of acid anions include $C_nF_{2n+1}COO^-$ (wherein n is an integer between 3 and 9 inclusive), $C_mF_{2m+1}SO_3^-$ (wherein m is an integer between 2 and 8 inclusive), $C_pF_{2p+1}SO_2)_2CH^-$ (P is an integer of from 1 to 18), $BF_4^-$, and $PF_6^-$.

Particularly preferred acid anions are those containing a perfluoroalkyl or perfluoroalkenyl group, or $PF_6^-$, since the diazo compound having these anions cause less increase in fogging during storage before use.

In consideration of storability, the diazonium salt compounds used in the present invention are preferably encapsulated in microcapsules. The method for microencapsulation is not particularly limited, and known methods may be used. Details of microencapsulation are described in JP-A No. 2-141279.

A routine method for microencapsulating a diazonium salt compound is as follows. A diazonium salt is dissolved in a hydrophobic solvent to prepare an oil phase. This is added to an aqueous solution of a water-soluble polymer (aqueous phase), and emulsified by use of, for example, a homogenizer. Prior to the emulsification step, a monomer or a prepolymer that can serve as the wall material of the microcapsules is added to the oil phase, or the aqueous phase or both. This allows a polymerization reaction to proceed between the interface of the oil phase and the aqueous phase, or causes a polymer to precipitate. In this way, a polymer wall which encapsulates the diazonium salt can be formed.

Methods for preparing microcapsules, including the above method, are described in detail, for example, in "Microcapsules" (written by Asashi Kondo, published by Nikkan Kogyo Shinbun-sha, 1970) and "Microcapsules" (by Tamotsu Kondo, published by Sankyo Shuppan, 1977).

Walls of the thus-formed microcapsules include diversified materials such as crosslinked gelatins, alginates, celluloses, urea resins, urethane resins, melamin resins, and nylon resins.

When the wall material of a microcapsule has a glass transition temperature, as do urea resins, urethane resins and the like, and the glass transition temperature is slightly higher than room temperature, the capsule wall is substance-nonpermeable at room temperature, but substance-permeable at a temperature higher than the glass transition temperature. Such materials are called heat-responsive microcapsules, and can be used to advantage in heat-sensitive recording materials.

The couplers which are used in the present invention and which react with the aforementioned diazonium salt compounds to produce colors can be selected according to the color hues required. Specific examples of the couplers include, but are not limited to, 2',5'-di-n-heptyloxy-acetoacetanilide, resorcine, phloroglucine, sodium 2,3-dihydroxynaphthalene-6-sulfonate, sodium 2-hydroxy-3-naphthalenesulfonate, 2-hydroxy-3-naphthalenesulfonic acid anilide, 2-hydroxy-3-naphthalenesulfonic acid morpholinoamide, 2-hydroxy-3-naphthalenesulfonic acid morpholinopropylamide, 2-hydroxy-3-naphthalenesulfonic acid-2-ethylhexyloxypropylamide, 2-hydroxy-3-naphthalenesulfonic acid-2-ethyl-hexylamide, sodium 1-hydroxy-8-acetylaminonaphthalene-3,6-disulfonate, 1-hydroxy-8-acetylaminonaphthalene-3,6-disulfonicacid dianilide, 1-hydroxy-2-naphthoic acid morpholinopropylamide, 1,5-dihydroxynaphthalene, 2,3-dihydroxynaphthalene, 2,3-dihydroxy-6-naphthalenesulfonic acid amide, 2-hydroxy-3-naphthoic acid morpholinopropylamide, 2-hydroxy-3-naphthoic acid anilide, 2-hydroxy-3-naphthoic acid-2'-methylanilide, 2-hydroxy-3-naphthoic acid ethanolamide, 2-hydroxy-3-naphthoic acid octylamide, 2-hydroxy-3-naphthoic acid morpholinoethylamide, 2-hydroxy-3-naphthoic acid piperidinoethylamide, 2-hydroxy-3-naphthoic acid piperidinopropylamide, 2-hydroxy-3-naphthoic acid-N-dodecyloxy-propylamide, 2-hydroxy-3-naphthoic acid tetradecylamide, 6-methoxy-2-hydroxy-3-naphthoic acid anilide, 6-ethoxy-2-hydroxy-3-naphthoic acid anilide, 6-methoxy-2-hydroxy-3-naphthoic acid morpholinopropylamide, 6-methoxy-2-hydroxy-3-naphthoic acid-2-hydroxyethylamide, acetanilide, acetoacetanilide, benzoylacetanilide, 1-phenyl-3-methyl-5-pyrazolone, 1-(2',4',6'-trichlorophenyl)-3-benzamide-5-pyrazolone, 1-(2',4',6'-trichlorophenyl)-3-anilino-5-pyrazolone, 1-phenyl-3-phenylacetamide-5-pyrazolone, 1-methyl-3-phenyl-2,4,6-(1H,3H,5H)-pyrimidinetrione, 1-octadecyloxypropyl-3-phenyl-2,4,6-(1H,3H,5H)-pyrimidinetrione, 1-phenyl-3-(2,5-dioctyloxyphenyl)-2,4,6-(1H,3H,5H)-pyrimidinetrione, 1,3-bis(2,5-dioctyloxyphenyl)-2,4,6-(1H,3H,5H)-pyrimidinetrione, 1,3-bis(n-octadecyloxycarbonylmethyl)-2,4,6-(1H,3H,5H)-pyrimidinetrione, 5,5-dimethyl-cyclohexane-1,3-dione, 5-(2-tetradecyloxyphenyl)cyclohexane-1,3-dione, N-(2-ethylhexyloxypropyl)-3-cyano-4-ethyl-6-hydroxy-2-pyridone, N-(dodecyloxypropyl)-3-acetyl-4-methyl-6-hydroxy-2-pyridone, and 7-[N-(n-octadecyl)-N-(2-ethylhexyl)]aminocarbonyl-methyloxy-4-hydroxycoumalin. These couplers may be used singly or in combinations of two or more species.

In the present invention, organic bases are preferably added for the purpose of accelerating color forming reactions. Examples of organic bases include nitrogen containing compounds such as tertiary amines, piperidines, piperazines, amidines, formamidines, pyridines, guanidines, and morpholines. Specific examples include piperazines such as N,N'-bis(3-phenoxy-2-hydroxypropyl)piperazine, N,N'-bis[3-(p-methylphenoxy)-2-hydroxypropyl] piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, and 1,4-bis{[3-(N-methylpiperazino)-2-hydroxy]propyloxy}benzene; morpholines such as N-[3-(β-naphthoxy)-2-hydroxy] propylmorpholine, 1,4-bis[(3-morpholino-2-hydroxy) propyloxy]benzene, and 1,3-bis[(3-morpholino-2-hydroxy) propyloxy]benzene; piperidines such as N-(3-phenoxy-2-hydroxypropyl)piperidine and N-dodecylpiperidine; and guanidines such as triphenylguanidine, tricyclohexylguanidine, and dicyclohexylphenylguanidine. These organic bases may be used singly or in combination.

In the present invention, the amounts of couplers and organic bases used are not particularly limited, but couplers and organic bases are preferably used in amounts of 1 to 30 moles per mole of diazonium salt compound.

Binders usable in the present invention are not particularly limited, and conventional binders may be used. Usable binders are described in detail in JP-A No. 2-141279.

In the present invention, in order to improve light-fastness, known antioxidants may be used. Examples of such antioxidants include those disclosed in European Patent Application Laid-Open No. 310551, German Patent Application Laid-Open No. 3435443, European Patent Application Laid-Open No. 310552, JP-A No. 3-121449, European Patent Application Laid-Open No. 459416, JP-A Nos. 2-262654, 2-71262, and 63-163351, U.S. Pat. No. 4,814,262, JP-A Nos. 54-48535, 5-61166, and 5-119449, U.S. Pat. No. 4,980,275, JP-A Nos. 63-113536 and 62-262047, European Patent Application Laid-Open Nos. 223739, 309402, and 309401. Further, known additives for heat-sensitive recording materials and pressure-sensitive recording materials may be advantageously used. Examples of these antioxidants include compounds disclosed in JP-A Nos. 60-125470, 60-125471, 60-125472, 60-287485, 60-287486, 60-287487, 62-146680, 60-287488, 62-282885, 63-89877, 63-88380, 63-088381, 1-239282, 4-291685, 4-291684, 5-188687, 5-188686, 5-110490, 5-170361, 63-203372, 63-224989, 63-267594, 63-182484, 60-107384, 60-107383, 61-160287, 61-185483, 61-211079, 63-251282, and 63-051174, and JP-B Nos. 48-043294 and 48-033212.

Specific examples include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanecarboxylate, 2,2-bis-4-hydroxyphenylpropane, 1,1-bis-4-hydroxyphenyl-2-ethylhexane, 2-methyl-4-methoxy-diphenylamine, and 1-methyl-2-phenylindole.

These antioxidants may be added to a heat-sensitive recording layer, an intermediate layer, or a protective layer.

In the present invention, phenol derivatives such as bisphenol compounds, naphthol derivatives, hydroxy compounds such as phenylbenzyl alcohol, and amide compounds such as carboxylic acid amides may be added in order to prevent deterioration of image quality due to precipitation of component materials of an emulsion during storage or to improve color density through improvement of the heat transmittance of microcapsule walls. Also, as acid stabilizers, there may be added citric acid, tartaric acid, oxalic acid, boric acid, phosphoric acid, and pyrophosphoric acid. In addition, various type of organic or inorganic pigments, a variety of stabilizers, and compounds having ultraviolet-transmittance-regulating functions may be added according to demands.

In the present invention, a full-color heat-sensitive recording material may be obtained through the lamination of heat-sensitive recording layers having different developed color hues to each other. The arrangement of layers is not particularly limited. Preferably, the full-color heat-sensitive recording material is composed of two heat-sensitive recording layers each containing a diazonium salt compound and a coupler to develop a color hue through thermal reaction, wherein the diazonium salt compounds in the heat-sensitive layers have different photosensitive wavelengths with each other and a third heat-sensitive recording layer containing an electron donating colorless dye and an electron accepting compound, these layers being layered.

Specifically, a full-color heat-sensitive recording material includes a support, a first heat-sensitive recording layer containing an electron donating colorless dye and an electron accepting compound, provided on the support, a second heat-sensitive recording layer containing a diazonium salt compound having a maximum absorption wavelength of 360±20 nm and a coupler to develop a color through thermal reaction with the diazonium salt compound, and a third heat-sensitive recording layer containing a diazonium salt compound having a maximum absorption wavelength of 400±20 nm and a coupler to develop a color through thermal reaction with the diazonium salt compound in this order. In this example, if color hues to be developed in the respective heat-sensitive recording layers are selected to be three primary colors of the subtractive color process, i.e. yellow, magenta, and cyan, it is possible to record an image in full color.

The method of recording with this full-color heat-sensitive recording material, comprises first, heating the third heat-sensitive recording layer to allow to react the diazonium salt compound with the coupler which are contained therein, and thereby developing a color. Next, the third heat-sensitive recording layer is irradiated with light having wavelengths of 400±20 nm to thereby degrade an unreacted diazonium salt compound contained therein. Thereafter, the second heat-sensitive recording layer is sufficiently heated to allow to react the diazonium salt compound with the coupler which are contained therein, thereby developing a color. By this step, the third heat-sensitive recording layer is also intensively heated, but does not develop a color because the diazonium salt compound contained therein has already been degraded, and the third heat-sensitive recording layer has already lost its color developing ability. Further, the second heat-sensitive recording layer is irradiated with light having wavelengths of 360±20 nm to thereby degrade an unreacted diazonium salt compound contained therein. Finally, the first heat-sensitive recording layer is given enough heat to effect color formation. At this step, the third and second heat-sensitive recording layers are also intensively heated, but do not develop colors because the diazonium salt compounds contained therein have already been degraded, since third and second heat-sensitive recording layers have already lost their color forming ability. This full-color heat-sensitive recording material is described in detail in JP-A No. 2-141279.

A heat-sensitive recording material of the present invention may further include layers other than heat-sensitive recording layers, if necessary. Specific examples include an undercoat layer provided between a support and a heat-sensitive recording layer, a protective layer provided on the topmost heat-sensitive recording layer, intermediate layers provided between layers, and a backcoat layer provided on the side of a support opposite to that on which heat-sensitive recording layers are provided.

The present invention may use conventionally known supports. Specific examples include neutralized paper, acid paper, recycled paper, paper laminated with polyolefin resin, synthetic paper, polyester film, cellulose derivative films such as cellulose triacetate film, polystyrene film, and polyolefin film such as polypropylene film and polyethylene film. They may be used singly or they maybe laminated. A support has a thickness of 20 μm to 200 μm.

The present invention employs compounds represented by formula (I) to thereby provide a heat-sensitive recording material having a high image density and excellent storability before use.

The present invention will now be described in detail by way of example. These examples do not limit the invention.

EXAMPLES

EXAMPLE 1

Synthesis of Compound of formula (I)

Synthesis of 3-(2-ethylhexyloxycarbonyl)-phenylsulfonamide

A suspension of 314 g of sodium 3-sulfobenzoate (1.4 mol) and 5.6 ml of dimethylformamide and 0.56 L of toluene was heated to 70° C. 0.26 ml of thionyl chloride (3.5 mol) was added dropwise thereto. The resultant mixture was stirred under reflux for 4 hours. Thereafter, excessive thionyl chloride and toluene were distilled off under reduced pressure. Further, 0.36 L of toluene was added, and toluene was distilled off under reduced pressure, and thus 3-chlorosulfonylbenzoic acid chloride was obtained.

To this reaction mixture, 219 g of 2-ethylhexyl alcohol (1.68 mol) was added dropwise at 40° C. The resultant mixture was stirred for 5 hours at 60° C. and then cooled to room temperature. Then, 1.0 L of ethyl acetate and 0.5 L of water were added thereto. The mixture was stirred and allowed to stand. An organic layer thus formed was taken out, and washed with saturated brine (0.4 L) and dried with magnesium sulfate. The solvent was distilled off, and 460 g of 3-(2-ethylhexyloxycarbonyl)phenylsulfonyl chloride was oobtained.

An ice-cooled solution of 460 g of 3-(2-ethylhexyloxycarbonyl)phenylsulfonyl chloride and 0.7 L of acetonitrile was added dropwise to 0.7 L of a 28% ammonia solution. The resultant mixture was stirred for 2 hours at room temperature. Thereafter, 0.7 L of water and 35 g of common salt were added thereto, followed by extraction with 1.0 L of ethyl acetate. The extract was washed with 0.5 L of diluted hydrochloric acid and 0.5 L of saturated brine and was then decolored with 20 g of active carbon. The active carbon was removed with Celite, and then the solvent was distilled off. 0.6 L of hexane was added and crystallized by cooling, and thus 338 g (1.08 mol, yield 77%) of 3-(2-ethylhexyloxycarbonyl)phenylsulfonamide was obtained m.p. 40° C. to 42° C.

Preparation of Microcapsule Solution A 2.8 parts of 4-tolylthio-2,5-dibutoxybenzenediazoniumhexafluoro phosphate and 10 parts of tricresyl phosphate were added to 19 parts of ethyl acetate and mixed uniformly. To the resultant mixture, 7.6 parts of TAKENATE D-110N (manufactured by Takeda Chemical Industries, Ltd.) serving as the microcapsule wall agent was added and mixed uniformly, yielding Solution I.

Next, 46.1 parts of an 8 wt. % aqueous solution of phthalated gelatin, 17.5 parts of water, and 2 parts of a 10% aqueous solution of sodium dodecylbenzenesulfonate were added to Solution I. The resultant mixture was emulsified for 10 minutes at 40° C. at a revolution number of 10,000 r.p.m. To the thus-obtained emulsion, 20 parts of water was added and mixed evenly. The resultant mixture was stirred and subjected to the encapsulation reaction for 3 hours at 40° C. Microcapsule solution A was obtained. The diameter of the capsules was 0.35 μm.

Preparation of Coupler/Base Emulsion B 3.2 parts of 3-(2-ethylhexyloxycarbonyl) phenylsulfonamide of the present invention, 2.4 parts of 2',5'-di-n-heptyloxy-2-acetoacetanilide, 2.5 parts of triphenylguanidine, 2.5 parts of 1,1-(p-hydroxyphenyl)-2-ethylhexane, 3.6 parts of 4,4'-(m-phenylene diisopropylidene)diphenol, 0.64 parts of tricresyl phosphate, and 0.32 parts of diethyl maleate were dissolved in 8 parts of ethyl acetate, to obtain Solution II.

32 parts of a 15 wt. % aqueous solution of lime-processed gelatin, 5 parts of a 10% aqueous solution of sodium dodecylbenzenesulfonate, and 30 parts of water were uniformly mixed at 40° C. Solution II was added to the resultant mixture, followed by emulsification for 10 minutes at 40° C. and at a revolution number of 10,000 r.p.m. by use of a homogenizer. The thus-obtained emulsion was stirred for 2 hours at 40° C. to remove ethyl acetate. Subsequently, the resultant emulsion was replenished with water having the same weight as that of removed ethyl acetate and water, Coupler/base emulsion B was thus obtained.

Preparation of Coating Solution C for Heat-Sensitive Recording Layer 6 parts of the microcapsule solution A, 4.4 parts of water, and 1.9 parts of a 15 wt. % aqueous solution of lime-processed gelatin were uniformly mixed. 8.3 parts of the coupler/base emulsion B was added to the resultant mixture and mixed uniformly, to obtain a coating solution C for a heat-sensitive recording layer.

Preparation of Coating Solution D for Protective Layer 32 parts of a 10% aqueous solution of polyvinyl alcohol (polymerization degree: 1700; saponification degree: 88%) 36 parts of water were uniformly mixed, to obtain a coating solution D for a protective layer.

Coating

The coating solution C for the heat-sensitive recording layer and the coating solution D for the protective layer were sequentially applied to a photographic printing paper support of the high quality paper laminated with polyethylene with a wire bar, followed by drying at 50° C. The target heat-sensitive recording material was obtained. The solutions C and D were applied in amounts of 6.4 $g/m^2$ and 1.05 $g/m^2{}_1$ respectively, in terms of solid matter.

Evaluation of Image Density and Density of Background Area of Material Surface

Electric power and pulse width were determined so as to obtain a recording energy per unit area of 40 $mJ/mm^2$. The thus determined power was applied in pulses to a thermal head (model KST) manufactured by Kyocera Corp., thereby thermally forming an image on the heat-sensitive recording material. Thereafter, the entire surface of the heat-sensitive recording material was irradiated for 15 seconds with light emitted from an ultraviolet lamp having an output of 40 W and a main wavelength of emitted light of 420 nm, thereby fixing the formed image.

The density of color-developed areas and density of background areas of the surface of the thus obtained heat-sensitive recording material was measured with a Macbeth densitometer.

Evaluation of Storability before Use

After being stored for 72 hours at 60° C. and 30% RH, a heat-sensitive recording material was evaluated based on the density of the background areas of the material surface measured with a Macbeth reflection densitometer.

EXAMPLE 2

A heat-sensitive recording material was formed and evaluated in a manner similar to that of Example 1 except that 3-(n-hexyloxycarbonyl)phenylsulfonamide was used in place of 3-(2-ethylhexyloxycarbonyl)phenylsulfonamide.

EXAMPLE 3

A heat-sensitive recording material was formed and evaluated in a manner similar to that of Example 1 except that 3-(n-pentyloxycarbonyl)phenylsulfonamide was used in place of 3-(2-ethylhexyloxycarbonyl)phenylsulfonamide.

EXAMPLE 4

A heat-sensitive recording material was formed and evaluated in a manner similar to that of Example 1 except that 3-(n-octyloxycarbonyl)phenylsulfonamide was used in place of 3-(2-ethylhexyloxycarbonyl)phenylsulfonamide.

EXAMPLE 5

A heat-sensitive recording material was formed and evaluated in a manner similar to that of Example 1 except that 3-(2-ethylhexanoylamino)phenylsulfonamide was used in place of 3-(2-ethylhexyloxycarbonyl)phenylsulfonamide.

EXAMPLE 6

A heat-sensitive recording material was formed and evaluated in a manner similar to that of Example 1 except that 2-(2-ethylhexanoylamino)phenylsulfonamide was used in place of 3-(2-ethylhexyloxycarbonyl)phenylsulfonamide.

EXAMPLE 7

A heat-sensitive recording material was formed and evaluated in a manner similar to that of Example 1 except that 2-(n-octyloxycarbonyl)phenylsulfonamide was used in place of 3-(2-ethylhexyloxycarbonyl)phenylsulfonamide.

EXAMPLE 8

A heat-sensitive recording material was formed and evaluated in a manner similar to that of Example 1 except that 2-(2-ethylhexyloxycarbonyl)phenylsulfonamide was used in place of 3-(2-ethylhexyloxycarbonyl) phenylsulfonamide.

EXAMPLE 9

A heat-sensitive recording material was formed and evaluated in a manner similar to that of Example 1 except that 4-(n-octyloxycarbonyl)phenylsulfonamide was used in place of 3-(2-ethylhexyloxycarbonyl)phenylsulfonamide.

EXAMPLE 10

A heat-sensitive recording material was formed and evaluated in a manner similar to that of Example 1 except that 4-(2-ethylhexyloxycarbonyl)phenylsulfonamide was used in place of 3-(2-ethylhexyloxycarbonyl) phenylsulfonamide.

COMPARATIVE EXAMPLE 1

A heat-sensitive recording material was formed and evaluated in a manner similar to that of Example 1 except that p-toluenesulfonamide was used in place of 3-(n-hexyloxycarbonyl)phenylsulfonamide.

COMPARATIVE EXAMPLE 2

A heat-sensitive recording material was formed and evaluated in a manner similar to that of Example 1 except that 4-ethylphenylsulfonamide was used in place of 3-(n-hexyloxycarbonyl)phenylsulfonamide.

The results are shown in Table 1.

TABLE 1

| Example | Image density | Density of background area | Storability before use |
|---|---|---|---|
| Example 1 | 1.15 | 0.08 | 0.08 |
| Example 2 | 1.18 | 0.08 | 0.09 |
| Example 3 | 1.16 | 0.08 | 0.09 |
| Example 4 | 1.15 | 0.08 | 0.08 |
| Example 5 | 1.15 | 0.09 | 0.08 |
| Example 6 | 1.12 | 0.09 | 0.08 |
| Example 7 | 1.13 | 0.09 | 0.09 |
| Example 8 | 1.12 | 0.09 | 0.09 |
| Example 9 | 1.14 | 0.09 | 0.09 |
| Example 10 | 1.13 | 0.08 | 0.09 |
| Com. Example 1 | 0.86 | 0.09 | 0.14 |
| Com. Example 2 | 0.95 | 0.08 | 0.12 |

What is claimed is:

1. A heat-sensitive recording material comprising a support and a heat-sensitive recording layer provided thereon and containing a diazonium salt compound and a coupler which reacts with the diazonium salt compound to form a color upon heating, wherein the heat-sensitive recording layer contains at least one compound represented by the following formula (I):

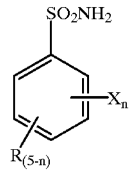

wherein R represents a member selected from the group consisting of a hydrogen atom, a halogen atom, an alkyl group, and an aryl group; X represents a member selected from the group consisting of —$COOR^1$, —$OCOR^1$, —$CONR^1R^2$, and —$NR^2COR^1$; $R^1$ represents an alkyl group or an aryl group, $R^2$ represents a member selected from the group consisting of a hydrogen atom, an alkyl group, and an aryl group; n represents an integer from 1 to 5; wherein when n is equal to or more than 2, X may be identical to or different from one another, and when n is equal to or less than 3, R may be identical to or different from one another.

2. A heat-sensitive recording material according to claim 1, wherein the diazonium salt is represented by the following formula (II):

$$ArN_2^+B^- \quad (II)$$

wherein Ar represents an aromatic moiety, $N_2^+$ represents a diazonium group, and $B^-$ represents an acid anion.

3. A heat-sensitive recording material according to claim 1, wherein R is a hydrogen atom.

4. A heat-sensitive recording material according to claim 1, wherein X is —$COOR^-$ or —$NR^2COR^1$.

5. A heat-sensitive recording material according to claim 1, wherein X is in the meta- position of the sulfamoyl group of the compound represented by formula (I).

6. A heat-sensitive recording material according to claim 1, wherein n is 0 or 1.

7. A heat-sensitive recording material according to claim 1, wherein the heat-sensitive recording layer contains the compound represented by formula (I) in an amount of 0.02–6 $g/m^2$.

8. A heat-sensitive recording material according to claim 1, wherein the heat-sensitive recording layer comprises the compound represented by formula (I) in an amount of 0.1–4 $g/m^2$.

9. A heat-sensitive recording material according to claim 1, wherein the heat-sensitive recording layer comprises an emulsion containing the compound represented by formula (I).

10. A heat-sensitive recording material according to claim 1, wherein the diazonium salt compound is encapsulated in microcapsules.

11. A heat-sensitive recording material according to claim 1, which further comprises an organic base.

12. A heat-sensitive recording material according to claim 1, which further comprises an antioxidant.

13. A full-color heat-sensitive recording material comprising a support and a plurality of heat-sensitive recording layers provided one upon another thereon, the layers respectively forming different developed color hues, wherein at least one of the heat-sensitive recording layers is a layer containing a diazonium salt compound and a coupler which reacts with the diazonium salt compound to form a color upon heating which layer contains at least one of the compounds represented by the following formula (I):

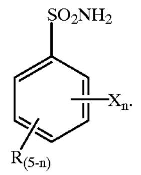

14. A full-color heat-sensitive recording material according to claim 13, which has an undercoat layer between the support and the lowermost heat-sensitive recording layer.

15. A full-color heat-sensitive recording material according to claim 13, which has a protective layer on the topmost heat-sensitive recording layer.

16. A full-color heat-sensitive recording material according to claim 13, which has intermediate layers between adjacent heat-sensitive recording layers.

17. A full-color heat-sensitive recording material according to claim 13, which has a backcoat layer on the side of the support opposite to that on which the heat-sensitive recording layers are provided.

18. A full-color heat-sensitive recording material comprising a support and a first heat-sensitive recording layer containing an electron-donating colorless dye and an electron-accepting compound, a second heat-sensitive recording layer containing a diazonium salt compound having a maximum absorption wavelength of 360±20 nm and a coupler which reacts with the diazonium salt compound to form a color, and a third heat-sensitive recording layer containing a diazonium salt compound having a maximum absorption wavelength of 400±20 nm and a coupler which reacts with the diazonium salt compound to form a color, sequentially coated on the support, wherein the second or the third heat-sensitive recording layer contains a compound represented by the following formula (I):

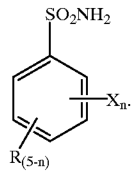

19. A full-color heat-sensitive recording material according to claim 18, which has a protective layer on the topmost heat-sensitive recording layer.

* * * * *